(12) United States Patent
Yu et al.

(10) Patent No.: US 9,443,956 B2
(45) Date of Patent: Sep. 13, 2016

(54) METHOD FOR FORMING AIR GAP STRUCTURE USING CARBON-CONTAINING SPACER

(71) Applicant: GLOBALFOUNDRIES Inc., Grand Cayman (KY)

(72) Inventors: Hong Yu, Rexford, NY (US); Biao Zuo, Mechanicville, NY (US); Jin Ping Liu, Ballston Lake, NY (US); Huang Liu, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/675,880

(22) Filed: Apr. 1, 2015

(65) Prior Publication Data

US 2016/0163816 A1 Jun. 9, 2016

Related U.S. Application Data

(60) Provisional application No. 62/089,004, filed on Dec. 8, 2014.

(51) Int. Cl.
*H01L 29/66* (2006.01)
(52) U.S. Cl.
CPC ..... *H01L 29/6656* (2013.01); *H01L 29/66545* (2013.01); *H01L 29/66795* (2013.01)
(58) Field of Classification Search
CPC ............ H01L 29/6656; H01L 29/66545; H01L 29/66795
See application file for complete search history.

(56) References Cited

U.S. PATENT DOCUMENTS

| | | | |
|---|---|---|---|
| 5,869,379 A | 2/1999 | Gardner et al. | 438/305 |
| 5,949,143 A | 9/1999 | Bang | 257/758 |
| 5,953,625 A | 9/1999 | Bang | 438/619 |
| 6,160,316 A | 12/2000 | Gardner et al. | 257/773 |
| 6,312,874 B1 | 11/2001 | Chan et al. | 430/314 |
| 6,376,330 B1 | 4/2002 | Fulford, Jr. et al. | 438/421 |
| 6,713,835 B1 | 3/2004 | Horak et al. | 257/522 |
| 6,737,725 B2 | 5/2004 | Nitta et al. | 257/522 |
| 6,838,354 B2 | 1/2005 | Goldberg et al. | 438/408 |
| 6,838,355 B1 | 1/2005 | Stamper et al. | 438/409 |
| 7,026,235 B1 | 4/2006 | Ben-Tzur et al. | 438/619 |
| 7,319,274 B2 | 1/2008 | Beyer et al. | 257/774 |
| 7,868,455 B2 | 1/2011 | Chen | 257/750 |

(Continued)

FOREIGN PATENT DOCUMENTS

| | | | |
|---|---|---|---|
| DE | 112007002215 T5 | 7/2009 | H01L 21/3205 |
| DE | 102008044984 A1 | 7/2010 | H01L 23/522 |

OTHER PUBLICATIONS

Lee and Graves, "The effect of VUV radiation from Ar/O2 plasmas on low-k SiOCH films," *J. Phys. D: Appl. Phys.*, 44:325203, 2011.

(Continued)

*Primary Examiner* — Mamadou Diallo
(74) *Attorney, Agent, or Firm* — Amerson Law Firm, PLLC

(57) ABSTRACT

A method includes forming a line feature above a substrate. Carbon-containing spacers are formed on sidewalls of the line feature. A first dielectric layer is formed above the carbon spacers and the line feature. The first dielectric layer is planarized to expose upper ends of the carbon-containing spacers. An ashing process is performed to remove the carbon-containing spacers and define air gaps adjacent the line feature. A cap layer is formed to seal the upper ends of the air gaps.

21 Claims, 4 Drawing Sheets

(56) References Cited

U.S. PATENT DOCUMENTS

| | | |
|---|---|---|
| 8,048,796 B2 | 11/2011 | Seidel et al. .................. 438/618 |
| 8,399,335 B2 | 3/2013 | Huisinga et al. ............. 438/421 |
| 8,883,610 B2 | 11/2014 | Seidel et al. .................. 438/411 |
| 2002/0158337 A1 | 10/2002 | Babich et al. ................ 257/758 |
| 2004/0213971 A1 | 10/2004 | Colburn et al. .............. 428/209 |
| 2004/0232552 A1 | 11/2004 | Wang et al. ................... 257/758 |
| 2005/0037604 A1 | 2/2005 | Babich et al. ................ 438/619 |
| 2006/0073695 A1 | 4/2006 | Filippi et al. ................ 438/619 |
| 2006/0088975 A1 | 4/2006 | Ueda .............................. 438/421 |
| 2007/0096319 A1 | 5/2007 | Hsu et al. ..................... 257/750 |
| 2007/0099417 A1 | 5/2007 | Fang et al. ................... 438/656 |
| 2007/0178713 A1 | 8/2007 | Jeng .............................. 438/787 |
| 2007/0259516 A1 | 11/2007 | Jahnes et al. ................ 438/618 |
| 2008/0073748 A1 | 3/2008 | Bielefeld et al. ............. 257/522 |
| 2008/0124917 A1 | 5/2008 | Oh et al. ....................... 438/637 |
| 2008/0169542 A1 | 7/2008 | Suzuki et al. ................ 257/684 |
| 2008/0169565 A1 | 7/2008 | Bonilla et al. ................ 257/761 |
| 2013/0320493 A1* | 12/2013 | Chang .................... H01L 21/02 257/532 |
| 2015/0243544 A1* | 8/2015 | Alptekin ............. H01L 21/7682 438/586 |
| 2015/0263122 A1* | 9/2015 | Hsiao ................... H01L 29/515 257/401 |

OTHER PUBLICATIONS

Translation of Official Communication from German Patent Office for German Patent Application No. 10 2009 023 377.6 dated Oct. 5, 2010.

Translation of Official Communication from German Patent Office for German Patent Application No. 10 2008 059 650.7 dated Sep. 25, 2009.

Translation of Official Communication from German Patent Office for German Patent Application No. 10 2008 059 650.7 dated Nov. 11, 2010.

Translation of Official Communication from German Patent Office for German Patent Application No. 10 2010 030 757.2 dated Feb. 18, 2011.

* cited by examiner

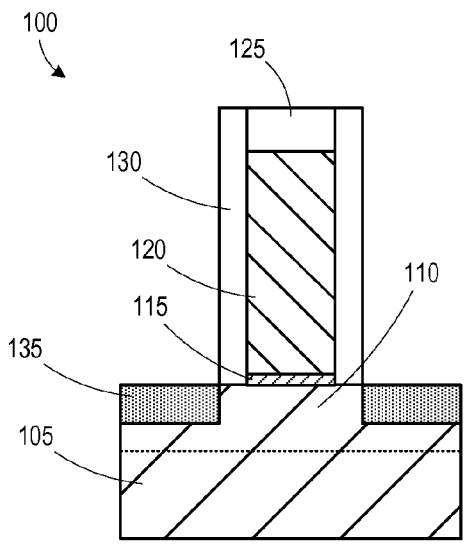
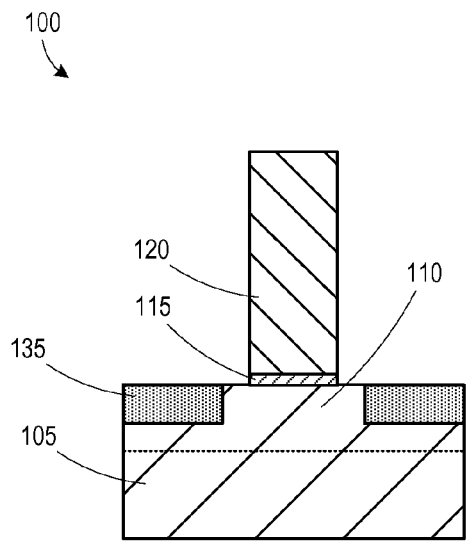
Figure 1A
Figure 1B
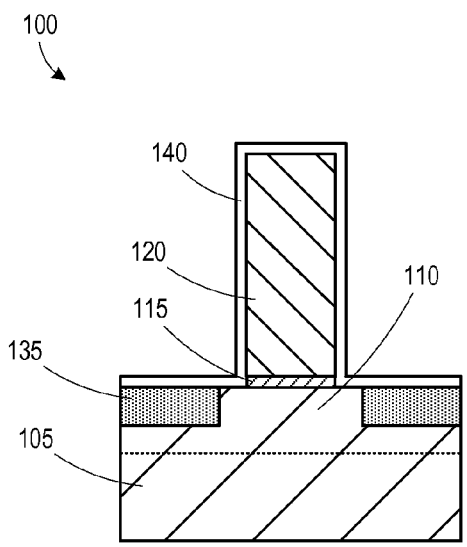
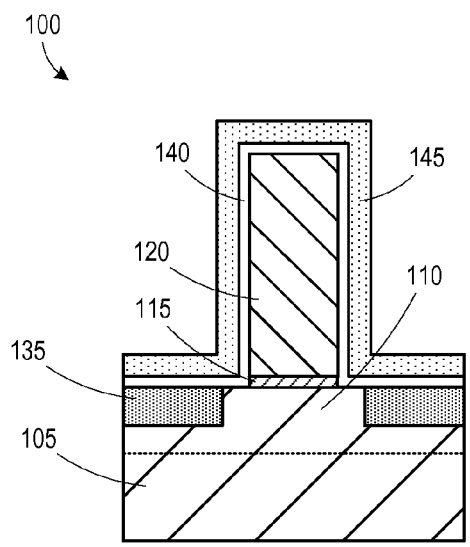
Figure 1C
Figure 1D

METHOD FOR FORMING AIR GAP STRUCTURE USING CARBON-CONTAINING SPACER

BACKGROUND OF THE INVENTION

1. Field of the Invention

The present disclosure generally relates to the fabrication of semiconductor devices, and, more particularly, to a method for forming an air gap structure using carbon-containing spacer.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A field effect transistor (FET), irrespective of whether an NMOS transistor or a PMOS transistor is considered, and irrespective of whether it is a planar or 3D finFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

The switching speed of a FET is affected not only by the channel length, but also by the materials employed, which affect the capacitance of the device. One technique for decreasing the device capacitance is to employ dielectric materials with reduced dielectric constants or so-called "low-k" materials. For this reason, it has been proposed to introduce "air gaps," at least in critical device areas, since air or similar gases may have a dielectric constant of approximately 1.0. One technique for forming air gaps involves forming nitride spacers on the sidewalls of a transistor gate structure, forming an interlayer dielectric layer above the gate electrode and planarizing it to expose the spacers. The spacers are removed using a selective etch process, leaving an air gap proximate the gate structure in the space that had been occupied by the spacer.

This process has several limitations as it requires the selective etching of the spacer material. As more exotic materials are used in the formation of transistor devices to improve performance, it becomes difficult to selectively etch the spacer material without damaging some other part of the transistor device. For example, silicon nitride is conventionally used for the spacer material, as it may be etched selectively to other dielectric materials in the device, such as silicon dioxide based dielectrics. Silicon nitride may also be used to protect the source/drain regions of the transistor device during the process flow. For example, the source/drain regions of a P-type transistor device may be provided with one type of epitaxial semiconductor material, while the source/drain regions of an N-type transistor device may be provided with a different type of epitaxial semiconductor material. The N-type transistors may be covered with a silicon nitride protective layer while the epitaxial semiconductor material is formed for the P-type devices, and vice versa. The selective etching of the spacers to provide air gaps can also remove the silicon nitride material protecting the source/drain regions, causing damage thereto.

Moreover, the planarization process to expose the spacers may also expose the gate structure or a protective cap layer (e.g., silicon nitride) formed thereabove. The selective spacer etch can also damage the gate structure or its cap layer, reducing performance or introducing defects.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes, among other things, forming a line feature above a substrate. Carbon-containing spacers are formed on sidewalls of the line feature. A first dielectric layer is formed above the carbon spacers and the line feature. The first dielectric layer is planarized to expose upper ends of the carbon-containing spacers. An ashing process is performed to remove the carbon-containing spacers and define air gaps adjacent the line feature. A cap layer is formed to seal the upper ends of the air gaps.

Another method includes, among other things, forming a gate structure above a substrate. Epitaxial semiconductor material regions are formed adjacent the gate structure. An inner spacer layer is formed covering the gate structure and the epitaxial semiconductor material regions. Carbon-containing spacers are formed on portions of the inner spacer layer disposed on sidewalls of the gate structure. An outer spacer layer is formed covering the carbon-containing spacers. A first dielectric layer is formed above the outer spacer layer. The first dielectric layer is planarized to expose upper ends of the carbon spacers. An ashing process is performed to remove the carbon-containing spacers and define air gaps adjacent the gate structure. A cap layer is formed to seal the upper ends of the air gaps.

BRIEF DESCRIPTION OF THE DRAWINGS

The disclosure may be understood by reference to the following description taken in conjunction with the accompanying drawings, in which like reference numerals identify like elements, and in which.

Figure 1E:
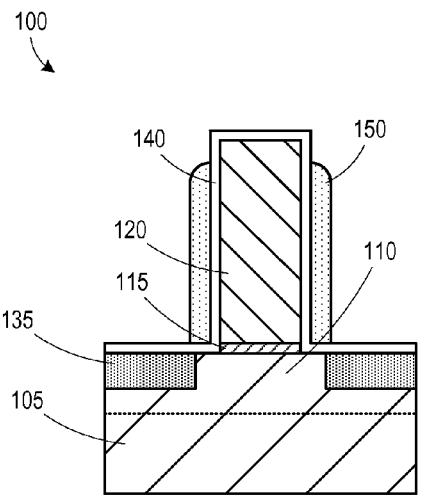
FIGS. 1A-1N depict various methods disclosed herein of forming an air gap structure adjacent a line feature.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming an air gap structure. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 1F:
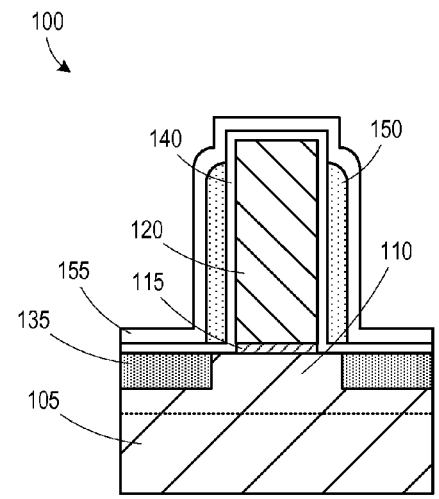
Figure 1G:
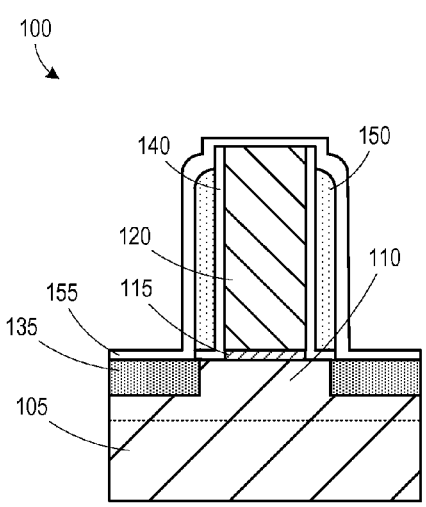
Figure 1H:
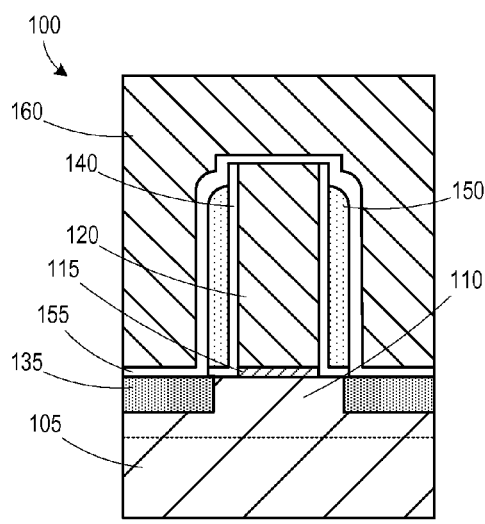
Figure 1I:
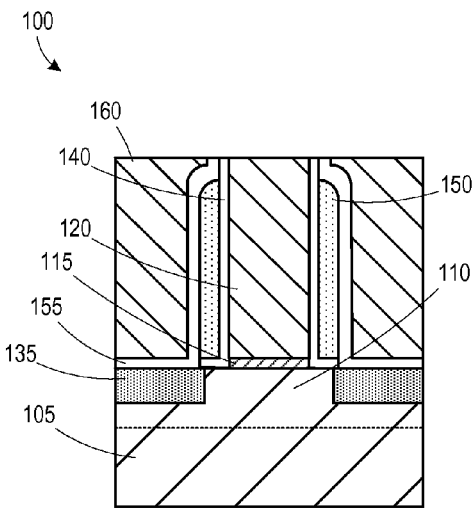
Figure 1J:
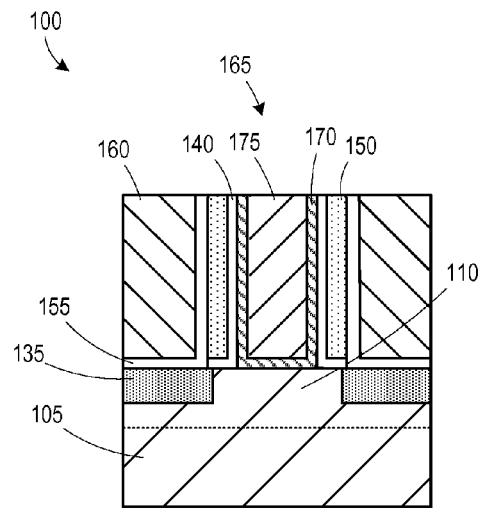
Figure 1K:
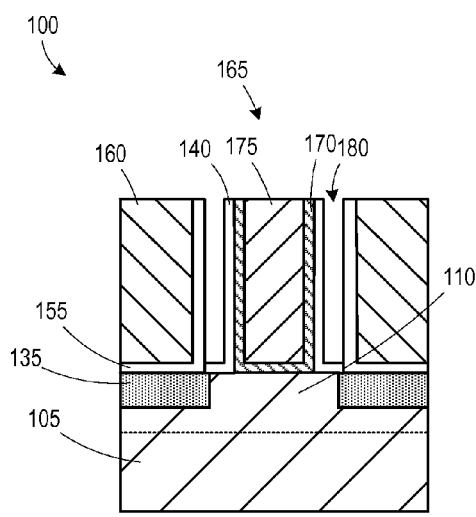
Figure 1L:
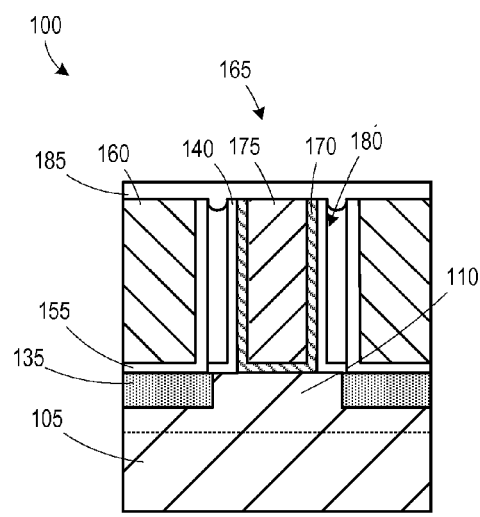
Figure 1M:
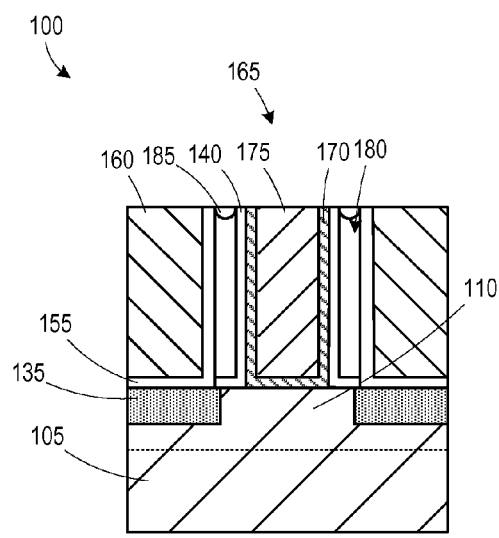
Figure 1N:
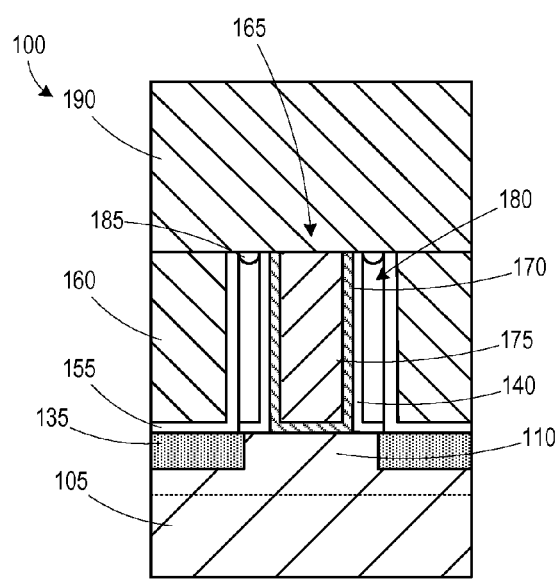

FIGS. 1A-1N illustrate various methods for forming an air gap structure adjacent a line feature in a semiconductor device 100. In the illustrated embodiment, the air gap structure is formed adjacent a gate structure for a finFET device, however, the application of the techniques are not limited to a particular type of device, and they may be applied to other structures that benefit from air gap structures, such as a planar transistor or a conductive interconnect line. FIGS. 1A-1N show a cross-sectional view (in the gate length direction of the device 100, i.e., in the direction of current flow when the device is operational) of a substrate 105 with a fin 110 defined therein. A placeholder gate structure includes a gate insulation layer 115 (e.g., silicon dioxide) and a placeholder material layer 120 (e.g., polysilicon). A cap layer 125 (e.g., silicon nitride) is formed above the placeholder material 120, and sidewall spacers 130 (e.g., silicon nitride) are formed on sidewalls of the placeholder material 120. Epitaxial semiconductor material 135 (e.g., silicon germanium, silicon carbon, silicon, silicon phosphorous, etc., depending on the particular transistor device type) is formed in trenches formed in the source/drain regions of the device.

The finFET device 100 depicted herein may be either an NMOS or a PMOS transistor. Additionally, various doped regions, e.g., halo implant regions, well regions and the like, may be formed in the substrate 105, the fin 110 or the epitaxial semiconductor material 135, but these doped regions are not depicted in the attached drawings. For example, the epitaxial semiconductor material 135 may be doped to define source/drain regions for the finFET device 100. The substrate 105 may have a variety of configurations, such as the depicted bulk silicon configuration. The substrate 105 may also have a silicon-on-insulator (SOI) configuration that includes a bulk silicon layer, a buried insulation layer and an active layer, wherein semiconductor devices are formed in and above the active layer. The substrate 105 and/or the fin 110 may be formed of silicon or silicon germanium or it may be made of materials other than silicon, such as germanium. Thus, the terms "substrate" or "semiconductor substrate" should be understood to cover all semiconducting materials and all forms of such materials. The substrate 105 may have different layers. For example, the fins 110 may be formed in a process layer formed above the base layer of the substrate 105.

FIG. 1B illustrates the device 100 after performing an etch process to remove the cap layer 125 and the sidewall spacers 130. FIG. 1C illustrates the device 100 after performing a conformal deposition process to form an inner spacer layer 140 (e.g., silicon nitride) above the placeholder material 120 and the epitaxial semiconductor material 135.

FIG. 1D illustrates the device 100 after performing a conformal deposition process to form a carbon-containing layer 145 (e.g., amorphous carbon) above the inner spacer layer 140. In some embodiments, the carbon-containing layer 145 should have a carbon concentration of at least 80 percent. In other cases, the layer 145 may be substantially pure carbon. FIG. 1E illustrates the device 100 after performing an anisotropic etch process to define carbon-containing spacers 150 from the carbon-containing layer 145. The inner spacer layer 140 may function as an etch stop layer during the etching of the carbon-containing layer 145. In some embodiments, a height of the carbon-containing spacers 150 is less than a height of the placeholder material 120.

FIG. 1F illustrates the device 100 after performing a conformal deposition process to form an outer spacer layer 155 above the carbon-containing spacers 150 and the inner spacer layer 140, thereby encapsulating the carbon-containing spacers 150.

In another embodiment, as illustrated in FIG. 1G, after the carbon-containing spacers 150 are defined, they are used as an etch mask during an anisotropic etch process to remove portions of the inner spacer layer 140 from above the placeholder material 120 and the epitaxial semiconductor material 135 prior to forming the outer spacer layer 155. This approach reduces the thickness of the spacer materials above the placeholder material 120 and the epitaxial semiconductor material 135, thereby reducing overall capacitance of the device 100.

FIG. 1H illustrates the device 100 after performing a deposition process to deposit an interlayer dielectric layer (ILD) 160 (e.g., a low-k dielectric material, wherein k has a value of less than about 3.4) above the outer spacer layer 155. For purposes of illustration, the process flow is illustrated as continuing from the embodiment of FIG. 1G, however, the process flow is the same if the embodiment of FIG. 1F is employed.

FIG. 1I illustrates the device 100 after performing a planarization process on the ILD layer 160 to expose the top surface of the placeholder material 120. Due to their respective height differences, the placeholder material 120 is exposed prior to exposing the carbon-containing spacers 150. FIG. 1J illustrates the device 100 after performing a plurality of processes to remove the placeholder material 120 and form a replacement gate structure 165 in its place. The processes may include performing one or more isotropic etch processes to remove the placeholder material 120 and the gate insulation layer 115 and one or more deposition processes to form a gate insulation layer 170 and one or more metal layers of a gate electrode 175. Depending upon the nature of the structure being formed, the metal layers may include one or more work-function adjusting metal layers, additional conductive layers, barrier layers, seed layers, and metal fill materials (not separately shown). During the formation of the gate electrode 175, excess material is provided that extends above the recess defined by removing the placeholder material 120. This excess material is removed by performing a planarization process. The planarization process is also performed to remove portions of the inner and outer spacer layers 140, 155 and expose the carbon-containing spacers 150, as shown in FIG. 1J.

FIG. 1K illustrates the device 100 after performing an ashing process to remove the carbon-containing spacers 150 to define air gaps 180 adjacent the gate structure 165. The inner and outer spacers 140, 155 protect the epitaxial semiconductor material 135 and the fin 110 during the ashing process. As the ashing process is not an etch process, there is no significant damage to the other materials used in the device 100.

FIG. 1L illustrates the device 100 after performing a deposition process to form a cap layer 185 (e.g., silicon nitride) over the ILD layer 160 to seal the upper ends of the air gaps 180. FIG. 1M illustrates the device 100 after performing an optional etch or planarization step to remove the portions of the cap layer 185 above the ILD layer 160 while leaving the portions sealing the upper ends of the air gaps 180 in position.

FIG. 1N illustrates the device 100 after performing a deposition process to deposit an additional interlayer dielectric layer (ILD) 190 (e.g., a low-k dielectric material) above the ILD layer 160. Removing the portions of the cap layer 185 above the ILD layer 160 prior to forming the interlayer dielectric layer (ILD) 190 reduces the overall capacitance of the device 100.

Additional process steps may be performed to complete the fabrication of the device 100, such as the forming of contacts to interface with the epitaxial semiconductor material 135, the gate electrode 175, etc. Subsequent metallization layers including interconnect lines and vias may be formed. Other layers of material, such as a stress-inducing contact etch stop layer and the like, may be present but are not depicted in the attached drawings.

Although the air gaps 180 are illustrated as being formed on a finFET transistor, a similar process may be used to form air gaps for a planar transistor or a conductive interconnect line in a subsequent metallization layer. In a general sense, the placeholder material 120 or the gate electrode 175 represent line features upon which the carbon-containing spacers 150 are formed and subsequently removed by an ashing process. Although a replacement gate or "gate last" technique is illustrated herein, the techniques may also be applied to a "gate first" technique, where a conductive gate electrode (e.g., doped polysilicon, silicide, metal, etc.) is formed prior to forming the carbon-containing spacers 150.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a line feature above a substrate, said line feature comprising a placeholder material;
    forming carbon-containing spacers on sidewalls of said line feature;
    forming a first dielectric layer above said carbon-containing spacers and said line feature;
    planarizing said first dielectric layer to expose said placeholder structure without exposing upper ends of said carbon-containing spacers;
    replacing said placeholder material with a conductive gate structure;
    further planarizing said first dielectric layer after forming said conductive gate structure to expose said upper ends of said carbon-containing spacers;
    performing an ashing process to remove said carbon-containing spacers and define air gaps adjacent said line feature; and
    forming a cap layer to seal the upper ends of said air gaps.

2. The method of claim 1, further comprising:
    forming an inner spacer on sidewalls of said line feature prior to forming said carbon-containing spacers; and
    forming an outer spacer over said carbon-containing spacers, wherein portions of said inner and outer spacers are removed during said planarizing to expose said upper ends of said carbon-containing spacers.

3. The method of claim 2, wherein said inner spacer is formed on a top surface of said line feature and on a surface of a semiconductor layer on which said line feature is formed, and the method comprises removing portions of said inner spacer from said top surface of said line feature and portions of said inner spacer on said surface of said semiconductor layer not covered by said carbon-containing spacers prior to forming said outer spacer.

4. The method of claim 3, wherein said semiconductor layer comprises epitaxial semiconductor material.

5. The method of claim 1, wherein forming said cap layer comprises forming said cap layer above said first dielectric layer and over the upper ends of said air gaps.

6. The method of claim 5, further comprising removing portions of said cap layer disposed above said first dielectric layer while leaving portions of said cap layer sealing said upper ends of said air gaps.

7. The method of claim 6, further comprising forming a second dielectric layer above said first dielectric layer.

8. The method of claim 1, wherein said carbon-containing spacers have a height less than a height of said placeholder material.

9. The method of claim 1, wherein said placeholder material comprises polysilicon.

10. The method of claim 1, further comprising
forming a fin in a substrate; and
forming said line feature above said fin.

11. The method of claim 1, wherein forming said carbon-containing spacers comprises:
forming an amorphous carbon layer above said line feature; and
anisotropically etching said amorphous carbon layer to define said carbon-containing spacers.

12. A method, comprising:
forming a gate structure above a substrate;
forming epitaxial semiconductor material regions adjacent said gate structure;
forming an inner spacer layer covering said gate structure and said epitaxial semiconductor material regions;
forming carbon-containing spacers on portions of said inner spacer layer disposed on sidewalls of said gate structure;
forming an outer spacer layer covering said carbon-containing spacers;
forming a first dielectric layer above said outer spacer layer;
planarizing said first dielectric layer to expose upper ends of said carbon-containing spacers;
performing an ashing process to remove said carbon-containing spacers and define air gaps adjacent said gate structure; and
forming a cap layer to seal the upper ends of said air gaps.

13. The method of claim 12, wherein said substrate comprises a fin, forming said gate structure comprises forming said gate structure above said fin, and forming said epitaxial semiconductor material regions comprises growing said epitaxial semiconductor material regions on portions of said fin not covered by said gate structure.

14. The method of claim 12, wherein said gate structure comprises a placeholder gate structure, and the method further comprises replacing said placeholder gate structure with a conductive gate structure prior to performing said ashing process.

15. The method of claim 12, wherein said carbon-containing spacers comprise amorphous carbon.

16. The method of claim 12, further comprising removing portions of said inner spacer layer disposed above said gate structure and portions of said inner spacer layer not covered by said carbon-containing spacers prior to forming said outer spacer layer.

17. The method of claim 12, wherein forming said cap layer comprises:
forming said cap layer above said first dielectric layer and over said upper ends of said air gaps; and
removing portions of said cap layer disposed above said first dielectric layer while leaving portions of said cap layer sealing said upper ends of said air gaps.

18. The method of claim 12, wherein said carbon-containing spacers have a height less than a height of said gate structure.

19. A method, comprising:
forming a line feature above a substrate;
forming an inner spacer on a top surface and sidewalls of said line feature and on a surface of a semiconductor layer on which said line feature is formed;
forming carbon-containing spacers on portions of said inner spacer layer disposed on sidewalls of said line feature;
removing portions of said inner spacer from said top surface of said line feature and portions of said inner spacer on said surface of said semiconductor layer not covered by said carbon-containing spacers;
forming an outer spacer over said carbon-containing spacers and said top surface of said line feature after removing said portions of said inner spacer layer;
forming a first dielectric layer above said outer spacer, said carbon-containing spacers, and said line feature;
planarizing said first dielectric layer to remove portions of said inner and outer spacers to expose upper ends of said carbon-containing spacers;
performing an ashing process to remove said carbon-containing spacers and define air gaps adjacent said line feature; and
forming a cap layer to seal upper ends of said air gaps.

20. The method of claim 19, wherein said line feature comprises a gate electrode structure.

21. The method of claim 19, wherein said line feature comprises a gate structure of a finFET transistor device, and the method further comprises:
forming a fin in a substrate; and
forming said gate structure above said fin.

* * * * *